(12) United States Patent
Liu et al.

(10) Patent No.: US 8,422,609 B2
(45) Date of Patent: Apr. 16, 2013

(54) AUTOMATIC FILTER-RESET MECHANISM

(75) Inventors: Jingfeng Liu, Longmont, CO (US);
Haotian Zhang, Longmont, CO (US);
Hongwei Song, Longmont, CO (US);
Lingyan Sun, Longmont, CO (US)

(73) Assignee: LSI Corporation, San Jose, CA (US)

( * ) Notice: Subject to any disclaimer, the term of this patent is extended or adjusted under 35 U.S.C. 154(b) by 868 days.

(21) Appl. No.: 12/570,326

(22) Filed: Sep. 30, 2009

(65) Prior Publication Data

US 2011/0075718 A1    Mar. 31, 2011

(51) Int. Cl.
*H04B 1/10*    (2006.01)

(52) U.S. Cl.
USPC ............ 375/350; 375/232; 375/267; 375/349

(58) Field of Classification Search .................... 375/350
See application file for complete search history.

(56) References Cited

U.S. PATENT DOCUMENTS

| | | | | |
|---|---|---|---|---|
| 5,159,609 A | * | 10/1992 | Palicot | 375/232 |
| 6,937,650 B2 | * | 8/2005 | Coker et al. | 375/232 |
| 2004/0165675 A1 | * | 8/2004 | Ito et al. | 375/267 |

* cited by examiner

*Primary Examiner* — Lihong Yu
(74) *Attorney, Agent, or Firm* — Mendelsohn, Drucker & Associates, P.C.; Steve Mendelsohn

(57) ABSTRACT

In one embodiment, a (hard-drive) read channel has a (DFIR equalization) filter, whose tap coefficients are adaptively updated. A reset controller monitors an (LLR) signal generated downstream of the filter to automatically determine when to reset the filter, e.g., by reloading an initial set of user-specified tap coefficients. For LLR values, the reset controller determines to reset the filter when the reset controller detects that too many recent LLR values have confidence values that are too low. When implemented in a hard-drive read channel, the reset controller can reset the filter one or more times during read operations within a sector of the hard drive.

14 Claims, 3 Drawing Sheets

AUTOMATIC FILTER-RESET MECHANISM

TECHNICAL FIELD

The disclosed subject matter is directed to signal processing, and in particular to signal processing that utilizes adaptive equalization filters.

BACKGROUND

FIG. 1 is a block diagram of a prior-art read channel 100 for a hard drive. Read channel 100 receives an analog input signal 121 corresponding to data stored on the hard drive and generates a digital decoded output signal 129 representing the data stored on the hard drive.

In particular, analog-to-digital converter (ADC) 122 digitizes analog input signal 121 to generate digital input signal 123. Digital finite impulse response (DFIR) filter 124 equalizes digital input signal 123 based on a set of tap coefficients 131 to generate equalized digital signal 125. Detector 126 converts equalized digital signal 125 into multi-bit log likelihood ratio (LLR) values 127, where each LLR value has a sign bit and a multi-bit confidence value. Detector 126, for example, implements a suitable detection technique such as Viterbi soft-output detection or maximum a posterioi (MAP) detection, to generate LLR values. Decoder 128 decodes the LLR values to generate decoded output signal 129.

DFIR filter 124 is an adaptive filter for which tap coefficients 131 are adaptively updated by DFIR adaptation accumulator 130. DFIR adaptation accumulator 130 receives an initial set of user-specified tap coefficients 133 via DFIR user-programmable port 132 and adaptively updates those tap coefficients to generate tap coefficients 131 to adapt the operations of DFIR filter 124 to dynamic signal conditions. DFIR adaptation accumulator 130 implements a least mean squares (LMS) algorithm based on (i) equalized signal 125 from DFIR filter 124 and (ii) sign bits of LLR values 127 from detector 126 to update the tap coefficients.

In typical hard-drive read-channel operations, a user reload signal 135 is asserted at the beginning of every sector of the hard drive to reload the initial set of user-specified tap coefficients 133 into DFIR adaptation accumulator 130 to reset tap coefficients 131. However, in low signal-to-noise environments, a small deviation of the DFIR filter 124 from its appropriate setting may lead to signals exceeding limits and causing runaway, leading to burst errors in decoded output signal 129, and may cause DFIR Filter 124 to further diverge.

SUMMARY

The disclosed subject matter addresses the problems of the contemporary art by providing a mechanism for automatically resetting an equalization filter, such as a digital finite impulse response (DFIR) filter, in the read channel of a hard drive during a read operation within a sector of the hard drive. The mechanism adaptively adjusts the filter coefficients to track signal condition changes in the read channel, but utilizes threshold processing to determine if the coefficients need to be automatically readjusted or reset within the particular sector being read, to avoid runaway. This mechanism can perform its operations dynamically and on-the-fly, without having to reread data.

In one embodiment, the present invention is a read channel, that includes a filter, a coefficient updater and a reset controller. The filter operates by filtering a signal based on a set of adaptively updated tap coefficients to generate a filtered signal. The coefficient updater generates the set of adaptively updated tap coefficients based on a set of initial tap coefficients, and the reset controller monitors a downstream signal derived from the filtered signal to determine when to reset the set of adaptively updated tap coefficients. This read channel can also be implemented in one or more integrated circuits.

Another embodiment is directed to a method for operating a read channel. The method includes filtering a signal based on a set of adaptively updated tap coefficients to generate a filtered signal. A set of adaptively updated tap coefficients based on a set of initial tap coefficients is generated, and a downstream signal, derived from the filtered signal to determine when to reset the set of adaptively updated tap coefficients, is monitored.

BRIEF DESCRIPTION OF THE DRAWINGS

Attention is now directed to the drawing figures, where like or corresponding numerals indicate like or corresponding components. In the drawings.

DETAILED DESCRIPTION OF THE DRAWINGS

Figure 1:
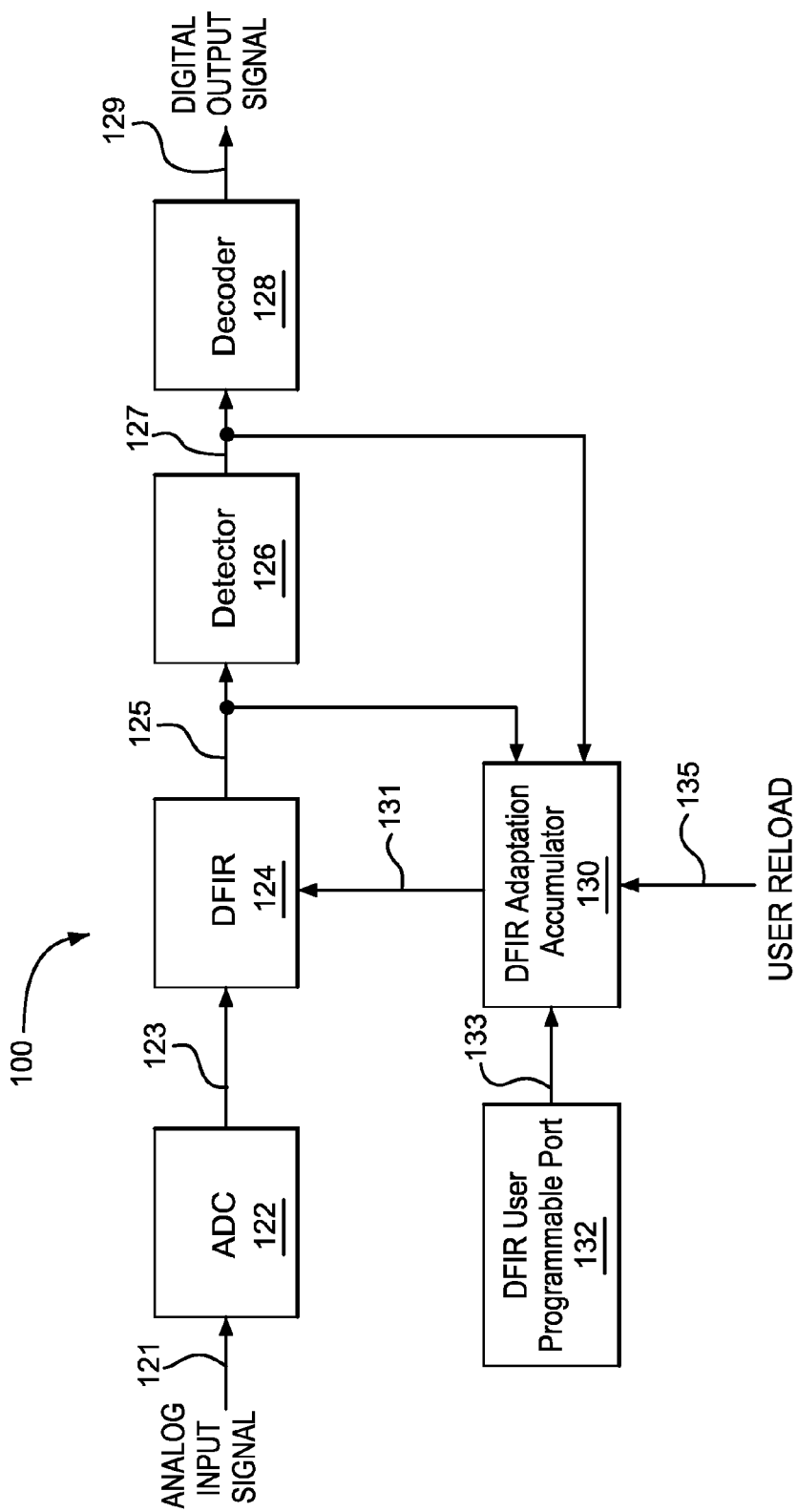
FIG. 1 is a block diagram of a prior-art read channel for a hard drive.
Figure 2:
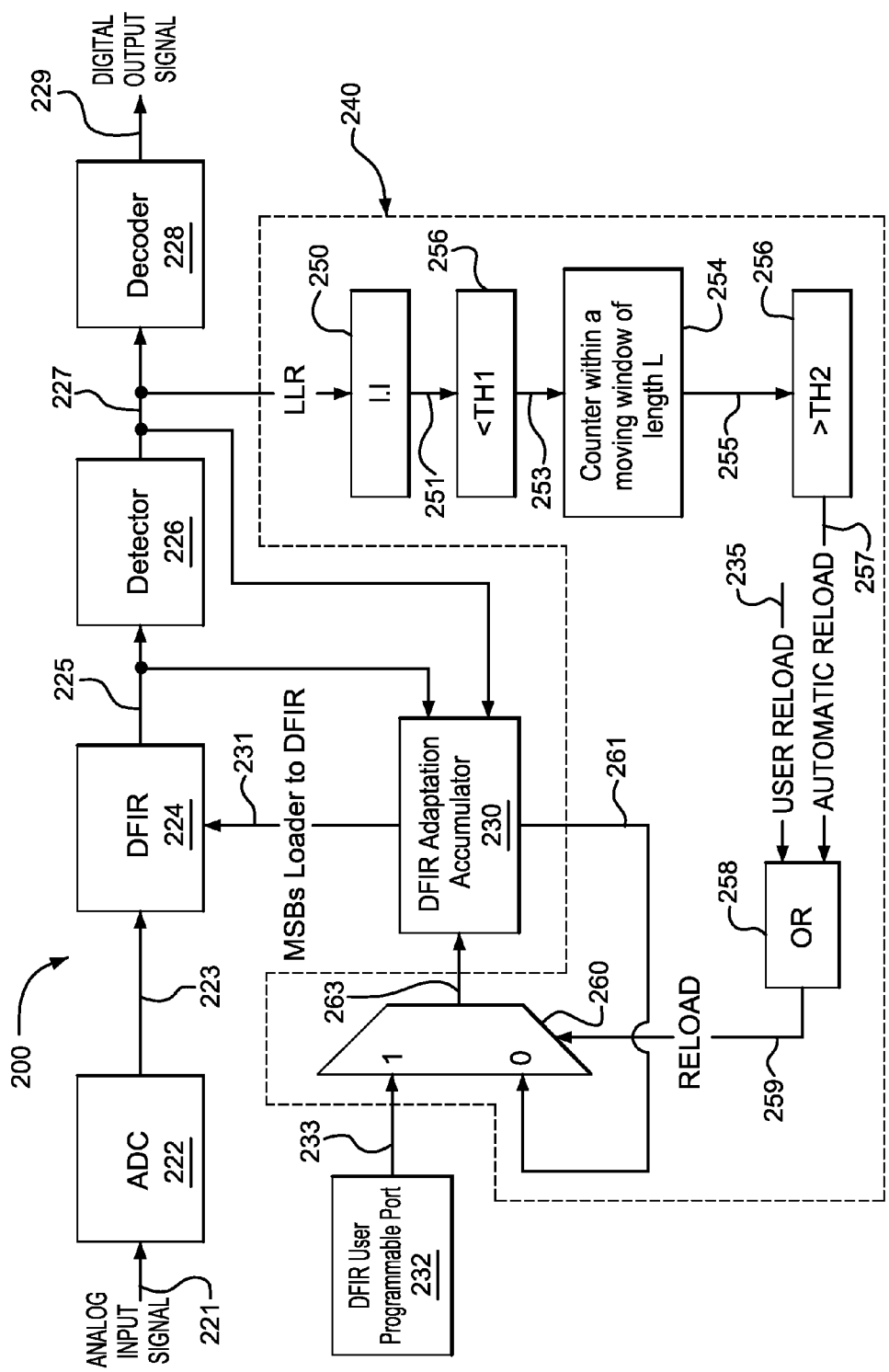
FIG. 2 is a block diagram of a read channel for a hard drive of the disclosed subject matter; and, FIG. 3 is a graphical representation of the counter value generated within the reset controller of FIG. 2.

FIG. 2 shows a block diagram of a read channel 200 for a hard drive of the disclosed subject matter. Like read channel 100 of FIG. 1, read channel 200 receives an analog input signal 221 corresponding to data stored on the hard drive and generates a digital decoded output signal 229 representing the data stored on the hard drive. Elements 222-232 and signals 221-235 of FIG. 2 are analogous to elements 122-132 and signals 121-135 of FIG. 1, respectively.

Read channel 200 also includes reset controller 240, which determines when to reload DFIR adaptation accumulator 230 with the user-specified tap coefficients 233 from DFIR user-programmable port 232.

In particular, magnitude detector 250 determines the magnitudes of LLR values 227 from detector 226 and outputs magnitude values 251. For example, if LLR values 227 are five-bit values having a sign bit and a four-bit confidence value, then magnitude detector 250 outputs the four-bit confidence values as magnitude values 251. LLR values having numbers of bits other than five are possible in other implementations of read channel 200.

Magnitude thresholder 252 compares each magnitude value 251 with a specified (programmable) magnitude threshold value TH1 and outputs a one-bit comparison signal 253 indicating whether or not the current magnitude value 251 is less than the magnitude threshold value TH1.

Counter 254 keeps track of the digital comparison signal values 253 for a moving (in time) window of (programmable) length L corresponding to the L most-recent LLR values 227 and generates a counter value 255 indicating how many of the magnitude values 251 are less than the magnitude threshold value TH1 for the current location of the moving window.

Counter thresholder 256 compares the current counter value 255 with a specified (programmable) counter threshold value TH2 and outputs a one-bit automatic reload signal 257 indicating whether or not the current counter value 257 is greater than the counter threshold value TH2. In the particular implementation of FIG. 2, if the current counter value 257 is greater than the counter threshold value TH2, then automatic reload signal 257 is set to 1 ("high").

Logic block 258 applies a logical "OR" operation to one-bit user reload signal 235 and one-bit automatic reload signal 257 to generate one-bit reload signal 259. If either reload signal 235 or 257 is high, then reload signal 259 will also be high. Note that, in other implementations, other suitable types of logical operations (e.g., "XOR") may be performed by logic block 258 depending, for example, on the logical definitions of binary reload signals 235 and 257 and the configuration of multiplexer (mux) 260.

Mux 260 receives (i) user-specified tap coefficients 233 from DFIR user-programmable port 232 at its "1" input and (ii) adaptively updated tap coefficients 261 from DFIR adaptation accumulator 230 at its "0" input. If reload signal 259 is low ("0"), then mux 260 re-applies adaptively updated tap coefficients 261 to DFIR adaptation accumulator 230 (via signal 263) for further adaptive updating in generating tap coefficients 231 for DFIR filter 224. On the other hand, if reload signal 259 is high ("1"), then mux 260 applies user-specified tap coefficients 233 to DFIR adaptation accumulator 230 (via signal 263) to reset the generation of tap coefficients 231 for DFIR filter 224. Note that, in a typical implementation of DFIR adaptation accumulator 230, each tap coefficient 231 applied to DFIR filter 224 is formed from a subset of bits corresponding to the most-significant bits (MSBs) of a corresponding tap coefficient 261 generated and re-used by accumulator 230 in its adaptive coefficient-updating process.

As described, reset controller 240 enables the operations of DFIR filter 224 to be reset upon either of two conditions. One condition is a manual-reload condition specified by the user via user reload signal 235. The other condition is an automatic-reload condition that occurs when controller 240 detects that too many LLR values 227 have confidence values that are too low. This latter condition indicates that the read channel might not be operating in a sufficiently accurate manner, which might be caused by the DFIR filter deviating from its appropriate setting. To address this situation, the tap coefficients are reset to their user-specified values.

User reload signal 235 can be used to manually reset the tap coefficients to their user-specified values at the start of reading each sector, as is done in the contemporary art. Note, however, that reset controller 240 can automatically reset the tap coefficients to their user-specified values via automatic reload signal 257 at any time, including one or more times during read operations within a sector.

Note that, in one implementation, the processing of controller 240 is reset every time reload signal 259 is asserted ("high"). Resetting the processing of controller 240 may include setting all of the values in the moving window to a value greater than the specified magnitude threshold TH1 to reset counter value 255 to zero. Such resetting of the processing of controller 240 limits the frequency at which the user-specified tap coefficients 233 can be reloaded into accumulator 230 to at most once for every TH2 LLR values 227.

Figure 3:
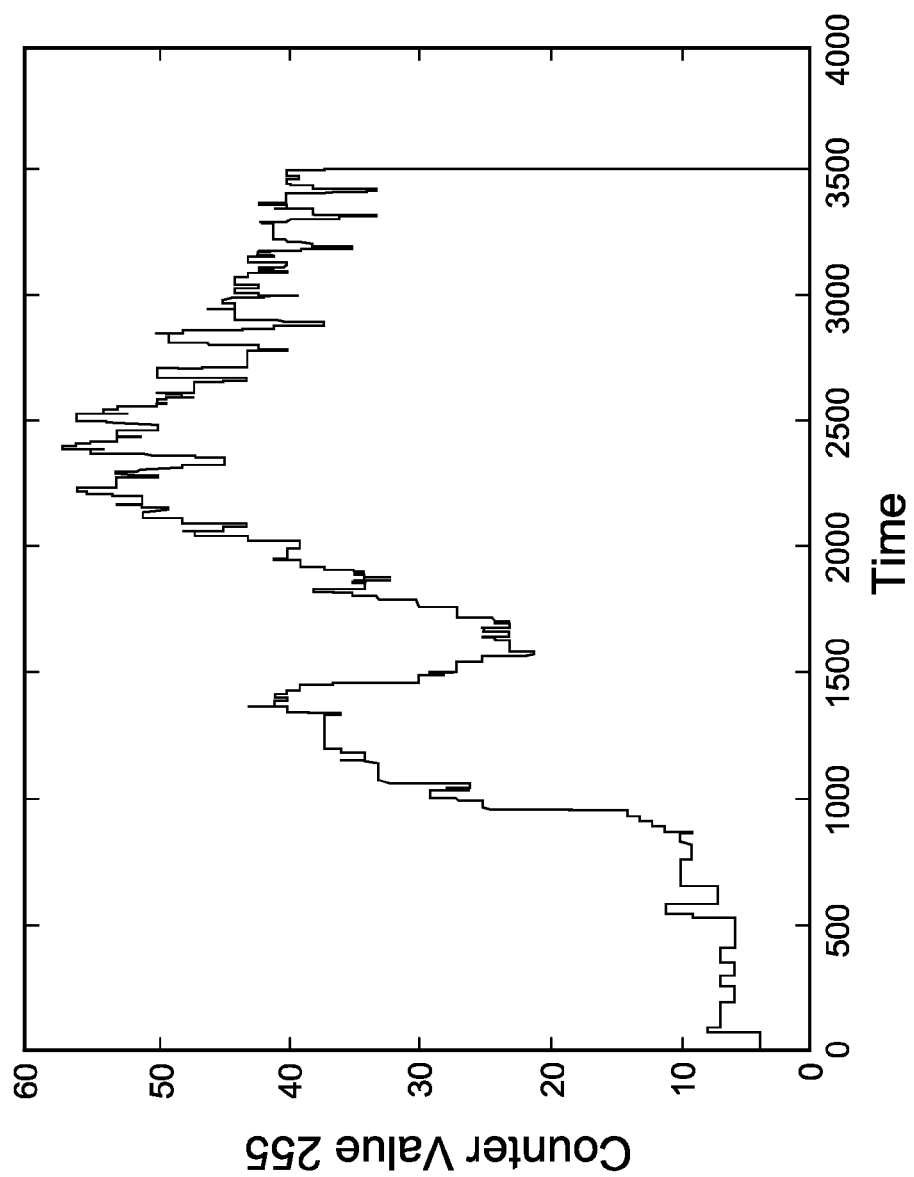

FIG. 3 is a graphical representation, as a function of time (in terms of LLR values 227), of counter value 255 generated within reset controller 240 of FIG. 2 using a magnitude threshold value TH1 of 10 and a window size L of 500 for five-bit LLR values 227 having four-bit confidence values. These results indicate that a counter threshold value TH2 of 40 can be used to determine when to reload the tap coefficients. TH2 can be obtained by counting the number of times loss of lock rate (LOLR) exceeding TH1 in a moving window of length L using nominal signal conditions and nominal DFIR settings occurs, and adding margins to it.

Although the disclosed subject matter was discussed in the context of a digital finite impulse response (DFIR) filter that equalizes signals within a hard-drive read channel, the present invention can be implemented for the same or other types of read channels, having the same or other types of equalization filters, such as digital infinite impulse response (DIIR) filters and/or analog adaptive DFIR filters. In addition, although the disclosed subject matter was discussed in the context of a reset controller that processes LLR values to determine when to reload the tap coefficients, the present invention can be implemented using reset controllers that determine when to reload tap coefficients by processing other suitable types of data, such as mean squared errors or the number of parity violations in the decode, etc.

Although the disclosed subject matter was discussed in the context of a DFIR adaptation accumulator that adaptively updates tap coefficients using an LMS algorithm, the invention is not so limited. In other implementations, other suitable types of adaptation algorithms can be used, such as a zero forcing algorithm.

Although the disclosed subject matter was discussed in the context of a reset controller that resets the tap coefficients by reloading the initial set of user-specified tap coefficients, the invention is not so limited. For example, in other implementations, the reset controller can reset the tap coefficients using other tap coefficients, such as a previously generated set of adaptively generated tap coefficients. Using such tap coefficients may accelerate the adaptation process to converge on appropriate tap coefficients for the current channel conditions.

The present invention may be implemented as (analog, digital, or a hybrid of both analog and digital) circuit-based processes, including possible implementations as one or more integrated circuits (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, micro controller, or general purpose computer.

The above-described processes including portions thereof can be performed by software, hardware, and combinations thereof. These processes and portions thereof can be performed by computers, computer-type devices, workstations, processors, micro-processors, other electronic searching tools and memory, and other storage-type devices associated therewith. The processes and portions thereof can also be embodied in programmable storage devices, for example, compact discs (CDs) or other discs including magnetic, optical, etc., readable by a machine or the like, or other computer usable storage media, including magnetic, optical, or semiconductor storage, or other source of electronic signals.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The processes (methods) and systems, including components thereof, herein have been described with exemplary reference to specific hardware and software. The processes (methods) have been described as exemplary, whereby specific steps and their order can be omitted and/or changed by persons of ordinary skill in the art to reduce these embodiments to practice without undue experimentation. The processes (methods) and systems have been described in a manner sufficient to enable persons of ordinary skill in the art to readily adapt other hardware and software as may be needed to reduce any of the embodiments to practice without undue experimentation and using conventional techniques.

While preferred embodiments of the disclosed subject matter have been described, so as to enable one of skill in the art to practice the present disclosed subject matter, the preceding description is intended to be exemplary only. It should not be used to limit the scope of the disclosed subject matter, which should be determined by reference to the following claims.

The invention claimed is:

1. A read channel comprising:
    a filter that filters a signal based on a set of adaptively updated tap coefficients to generate a filtered signal;
    a coefficient updater that generates the set of adaptively updated tap coefficients based on a set of initial tap coefficients;
    a reset controller that monitors a downstream signal derived from the filtered signal to determine when to reset the set of adaptively updated tap coefficients;
    a detector that converts the filtered signal into log likelihood ratio (LLR) values;
    a decoder that decodes the LLR values to generate a digital output signal; and
    a port for providing the set of initial tap coefficients to the coefficient updater, wherein:
        the coefficient updater utilizes the filtered signal and the LLR values to generate the set of adaptively updated tap coefficients based on the set of initial tap coefficients; and
        the reset controller monitors the LLR values derived from the filtered signal to determine when to reset the set of adaptively updated tap coefficients.

2. The invention of claim 1, wherein the read channel is a hard-drive read channel, and the reset controller is configured for automatically resetting the set of adaptively updated tap coefficients two or more times within a sector of the hard drive.

3. The invention of claim 1, wherein the filter is a digital finite impulse response (DFIR) equalization filter, and the coefficient updater is a DFIR adaptation accumulator that adaptively updates the tap coefficients using a least mean squares (LMS) algorithm.

4. The invention of claim 1, wherein the downstream signal comprises log likelihood ratio (LLR) values, each LLR value having a sign bit and a multi-bit confidence value, and the reset controller determines resetting of the set of adaptively updated tap coefficients when the reset controller detects that more than a specified count of LLR values, within a window of a predetermined count size, have multi-bit confidence values that are less than a specified magnitude threshold.

5. The invention of claim 1, wherein the reset controller resets the set of adaptively updated tap coefficients by reloading the set of initial tap coefficients into the coefficient updater.

6. The invention of claim 5, wherein the reset controller reloads the set of initial tap coefficients automatically or in response to a manually activated signal.

7. A machine-implemented method for operating a read channel, the method comprising:

(a) the machine filtering a signal based on a set of adaptively updated tap coefficients to generate a filtered signal;
(b) the machine generating the set of adaptively updated tap coefficients based on a set of initial tap coefficients; and
(c) the machine monitoring a downstream signal derived from the filtered signal to determine when to reset the set of adaptively updated tap coefficients, wherein:
    step (a) further comprises converting the filtered signal into a log likelihood ratio (LLR) values and decoding the LLR values to generate a digital output signal;
    step (b) comprises generating the set of adaptively updated tap coefficients based on the set of initial tap coefficients from the filtered signal and the LLR values; and
    step (c) comprises monitoring the LLR values derived from the filtered signal to determine when to reset the set of adaptively updated tap coefficients.

8. The method of claim 7, wherein:
the read channel is a hard-drive read channel; and
the method further comprises automatically resetting the set of adaptively updated tap coefficients two or more times within a sector of the hard drive.

9. The method of claim 7, wherein:
the filtering is digital finite impulse response (DFIR) equalization filtering; and
the set of adaptively updated tap coefficients is generated using a least mean squares (LMS) algorithm.

10. The method of claim 7, wherein:
the downstream signal comprises log likelihood ratio (LLR) values, each LLR value having a sign bit and a multi-bit confidence value; and
the set of adaptively updated tap coefficients are reset when the machine detects that more than a specified count of LLR values, within a window of a predetermined count size, have multi-bit confidence values that are less than a specified magnitude threshold.

11. The method of claim 7, wherein the set of adaptively updated tap coefficients are reset by reloading the set of initial tap coefficients.

12. The method of claim 11, wherein reloading the set of initial tap coefficients is automatic or in response to a manually activated signal.

13. A read channel comprising:
    a filter that filters a signal based on a set of adaptively updated tap coefficients to generate a filtered signal;
    a coefficient updater that generates the set of adaptively updated tap coefficients based on a set of initial tap coefficients; and
    a reset controller that monitors a downstream signal derived from the filtered signal to determine when to reset the set of adaptively updated tap coefficients, wherein the downstream signal comprises log likelihood ratio (LLR) values, each LLR value having a sign bit and a multi-bit confidence value, and the reset controller determines resetting of the set of adaptively updated tap coefficients when the reset controller detects that more than a specified count of LLR values, within a window of a predetermined count size, have multi-bit confidence values that are less than a specified magnitude threshold.

14. A machine-implemented method for operating a read channel, the method comprising:

(a) the machine filtering a signal based on a set of adaptively updated tap coefficients to generate a filtered signal;

(b) the machine generating the set of adaptively updated tap coefficients based on a set of initial tap coefficients; and
(c) the machine monitoring a downstream signal derived from the filtered signal to determine when to reset the set of adaptively updated tap coefficients, wherein:
the downstream signal comprises log likelihood ratio (LLR) values, each LLR value having a sign bit and a multi-bit confidence value; and
the set of adaptively updated tap coefficients are reset when the machine detects that more than a specified count of LLR values, within a window of a predetermined count size, have multi-bit confidence values that are less than a specified magnitude threshold.

* * * * *